United States Patent [19]
Feinberg et al.

[11] Patent Number: 5,910,903
[45] Date of Patent: Jun. 8, 1999

[54] METHOD AND APPARATUS FOR VERIFYING, ANALYZING AND OPTIMIZING A DISTRIBUTED SIMULATION

[75] Inventors: Jerry M. Feinberg, Arlington; Christopher H. Johnson, Oakton; Bruce W. Stalcup, Springfield, all of Va.

[73] Assignee: PRC Inc., McLean, Va.

[21] Appl. No.: 08/903,733

[22] Filed: Jul. 31, 1997

[51] Int. Cl.⁶ ........................................ G06F 9/455
[52] U.S. Cl. .................. 364/578; 364/138; 364/132; 364/188; 395/200; 395/183.14; 395/183.01; 395/182.05; 395/500
[58] Field of Search ................... 364/578, 188, 364/132, 138; 395/182.05, 183.14, 200.54, 200.32, 183.01, 500

[56] References Cited

U.S. PATENT DOCUMENTS

| | | | |
|---|---|---|---|
| 4,456,994 | 6/1984 | Segarra | 371/16 |
| 4,882,752 | 11/1989 | Lindman et al. | 380/25 |
| 5,204,897 | 4/1993 | Wyman | 380/4 |
| 5,485,408 | 1/1996 | Blomquist | 364/578 |
| 5,553,003 | 9/1996 | Harada et al. | 364/492 |
| 5,701,439 | 12/1997 | James et al. | 395/500 |
| 5,715,184 | 2/1998 | Tyler et al. | 364/578 |
| 5,745,879 | 4/1998 | Wyman | 380/4 X |
| 5,754,763 | 5/1998 | Bereiter | 380/4 X |
| 5,850,345 | 12/1998 | Son | 364/578 |

OTHER PUBLICATIONS

'An Object–Oriented Kernel for Distributed Simulation of Concurrent Systems', Abstract from Microprocessing and Microprogramming, V34 Issue 1–5 by Piechowka, Maciej, Feb. 1992.

*Primary Examiner*—Kevin J. Teska
*Assistant Examiner*—Lonnie Knox
*Attorney, Agent, or Firm*—Rothwell, Figg, Ernst & Kurz

[57] ABSTRACT

A method and apparatus for verifying, analyzing and optimizing a distributed simulation conducted on one or more simulation components from one or more control computers where the present invention may be overlaid onto a distributed simulation as may be conducted by technologies now known for conducting such simulations, where each simulation component has simulator middleware which is operatively connected to a control computer and where the control computer has agent-applications which it may send to the simulator middleware of one or more selected simulation components to perform a task such as gathering data about a simulation entity and return that data to the control computer for subsequent analysis such as calculating average characteristics or effectiveness of simulation components and having tools for optimizing the distributed simulation by modifying or creating agent-applications to send to selected simulators which change the parameters of the distributed simulation and re-run the distributed simulations.

25 Claims, 4 Drawing Sheets

METHOD AND APPARATUS FOR VERIFYING, ANALYZING AND OPTIMIZING A DISTRIBUTED SIMULATION

CROSS REFERENCE TO RELATED APPLICATIONS

This application is related to subject matter disclosed in co-pending application Ser. No. 08/900,133 filed Jul. 25, 1997, entitled "System and method for controlling and monitoring remote distributed processing systems."

BACKGROUND

Currently, distributed simulations are formed by connecting two or more individual simulation components via a communication medium (e.g., WAN, LAN, satellite, telephone lines, etc.). These simulation components, in general, have been constructed separately from one another, and therefore have varying degrees of compatibility. There are three basic types of simulation components—"live" (e.g., an actual M1A1 tank outfitted with a "black box" to measure various aspects of the tank operations such as speed, direction, operational status of instruments, and data received from various sources), "virtual" which uses mock up hardware to provide input into a simulation entity (e.g., a flight simulator cockpit), and "constructive" simulation components which generally will comprise a computer and computer software which models a simulation entity. The various simulation components may differ in resolution, in number and type of inputs/outputs, environmental data requirements, hardware, software, operating systems, etc. Various simulation protocols such as Defense Interactive Simulation (DIS) or High-Level Architecture (HLA) allow these individual simulation components (which may be referred to as "Entities" in a DIS environment or "Federates" in an HLA environment), despite their differences, to be linked into a united simulation. Distributed simulations are important in a number of applications, especially in Defense industries and in the military, where they are used in training, mission planning, system design, acquisitions, Command Control Communication Computers Intelligent Surveillance & Reconnaissance ("C4ISR") applications, system design and acquisitions.

The following are examples of other applications of distributed simulations and the organizations and industries interested in such distributed simulations: air traffic control and airplane crash simulations (Federal Aviation Administration), streamlining of postal routes and personnel (U.S. Postal Service), traffic simulations and highway and road planning (Federal and state departments of transportation), land use and environmental simulations, natural disaster simulations (Federal Emergency Management Agency), and multiplayer videogames (entertainment industries).

With reference to FIG. 1, a prior art system is illustrated for conducting a distributed simulation of a tank's defense against a missile fired from a plane on four simulation components 100 running simulation models 130 on various simulation processors 105 using Defense Interactive Simulation ("VDIS") protocol software 110. The DIS software 110 on each simulation component 100 broadcasts Protocol Data Units ("PDUs") 120 to the DIS software 110 on each of the other simulation components 100. Each PDU 120 comprises information about the particular simulation entity 130 running on the simulation component 100 on which the DIS software 110 is resident so that each simulation component 100 may determine the relationship between each of the simulation entities 130.

In the example of FIG. 1, simulation component A comprises a mock cockpit as its simulation processor 105 running software which simulates a plane as its simulation entity 130, simulation component B comprises a black box which may be constructed in any manner known to those skilled in the art and depending upon the purpose of the simulation which is operatively connected to an actual tank where the tank is the simulation entity 130, and simulation component C comprises a Sun workstation as the simulation processor 105 running a computer software model of a missile which model is the simulation entity 130, and simulation component D comprises an Intel-based personal computer as the simulation processor 105 running a computer software model of a radar system as its simulation entity 130. As may be seen from the diagram, each of the simulation processors 105 are running DIS software 110 where the DIS software on each simulation component 100 passes a PDU 120 to each of the other simulation components 100.

The problem is that merely connecting all the simulation components into such a distributed simulation does not verify or validate that the simulation accurately models reality; it also does not inherently assure that data from the simulation can be captured easily and analyzed, in order that the simulation can be used effectively in making decisions; finally, the fundamental purpose of a simulation is to allow quick discovery of a "best" or optimum solution without having to play out the options in live tests or prototypes (e.g., "How can I win a war faster or with fewer casualties?"). Little attention has been given, however, to optimization tools to serve these purposes. Accordingly, while it is possible to build very sophisticated distributed simulations that model very complex problems, the tools that would ensure that those simulations are relevant and powerful in solving problems, saving money, building optimum designs, etc., have not appeared yet.

Referring again to FIG. 1, prior to the present invention there was no way to determine whether PDU D arrived at simulation component B with the correct data or at an acceptable time (e.g., not too much latency between the time PDU D is sent by simulation component D and the time it is received by simulation component B) such that the tank simulation entity would detect the approach of the missile simulation entity with enough accuracy in the simulation that the simulation would be useful with respect to its objective (e.g., determining whether a tank's defense system would detect a missile in time to avoid it given the tank's current equipment, will the missile show up on the tank's radar, etc.). In order to draw valid conclusions about the performance of the tank's missile defense system, it is imperative that not only are the simulation components of high enough quality individually to support the accuracy required but also that each simulation component's view of the simulation be consistent in both space and time with the other simulation components.

Prior to the present invention, answers to crucial questions about the distributed simulation could not be answered without either (a) disturbing the distributed simulation or (b) considerable one-time setup effort. Examples of some of these crucial questions are: Is the data flow correct? Is the information content within the PDUs correct? Is the information content appropriate? Is the information content having an effect on the other simulation components? Is the distributed simulation exercise producing the interactions and data required for analyzing the problems necessitating the exercise in the first place? Is the distributed simulation exercise producing the data for calculating the measures of effectiveness and performance which will provide useful information?

The prior art attempts at addressing the problem of verifying the accuracy of a distributed simulation consists principally in reviewing the source code generating an individual simulation entity in a constructive simulation to ensure that calculation of parameters is correct and in accordance with the best known principles of physics, and in running individual simulation entities and comparing results to empirical observations to ensure that the simulation entity is developing answers that match real-life Little or nothing has been done to validate the proper interaction of simulation models in a distributed simulation to ensure that data exchanges, perceptions of environmentals, spatial registrations, etc., are consistent, correct, and maintain an accurate reflection of reality.

In order to capture and analyze distributed simulation data, prior art systems had to develop in parallel with the simulation a large, monolithic software package to collect and analyze data. The disadvantages of this approach are legion: it is expensive, and time-consuming; it can require modification to individual simulation models in order to access data held within files; it exerts a huge overhead on the overall hardware system (e.g., computer processing time, RAM, disk storage, communication throughput); it is unresponsive to new demands for additional data and analysis; it does not adapt readily to the addition of new simulation models; it requires frequent re-writes and re-compiles to incorporate improvements and adjustments; and it requires individual builds to accommodate each separate computer platform (e.g. such as an IBM MVS system, mini computer, DEC Alpha, SUN, SGI, or a personal computer based upon a microprocessor by Intel, AMD, Cyrix, or Motorola) and operating systems (e.g. DOS, Windows 95, UNIX, etc.).

No prior art implements optimization techniques for distributed simulations.

SUMMARY OF THE INVENTION

The present invention solves the problems of the prior art.

A preferred embodiment of the present invention is a system of platform-independent software tools, which operate in the background of a distributed simulation, and perform the following essential services: observe the internal operation and verify proper interaction of models within a simulation; analyze simulation results then produce defendable and actionable conclusions; and enable optimization required for quick convergence on a best solution.

In a preferred embodiment, a control computer is connected to an existing distributed simulation network. Since Java™ is a largely platform independent programming environment, the control computer contains a rich library of Java™ agent-applications.

A user selects and initializes Java™ data-collection agent-applications based on specific data and analysis requirements of the next simulation run; the selected Java™ agent-applications are distributed by the control computer at runtime to simulation components on the network; these Java™ agent-applications capture and pre-analyze data from the simulation components running the various simulation entities, and return key data to the control computer.

Retrieved data is used by the remote host as inputs into Verification, Validation and Accreditation ("VV&A"), analysis, and optimization tools.

The design of this preferred embodiment allows for broad flexibility in collecting data from any simulation component in the distributed simulation; for returning that data in real-time or post-simulation as required; for using commercial off the shelf ("COTS"), government off the shelf ("GOTS") or customized computer software applications to perform VV&A, analysis, and optimization functions consistent with the collected data; and for implementing new data collection as required to react to new questions, new simulation objectives, new simulations, etc.

DETAILED DESCRIPTION OF THE INVENTION

Figure 1:
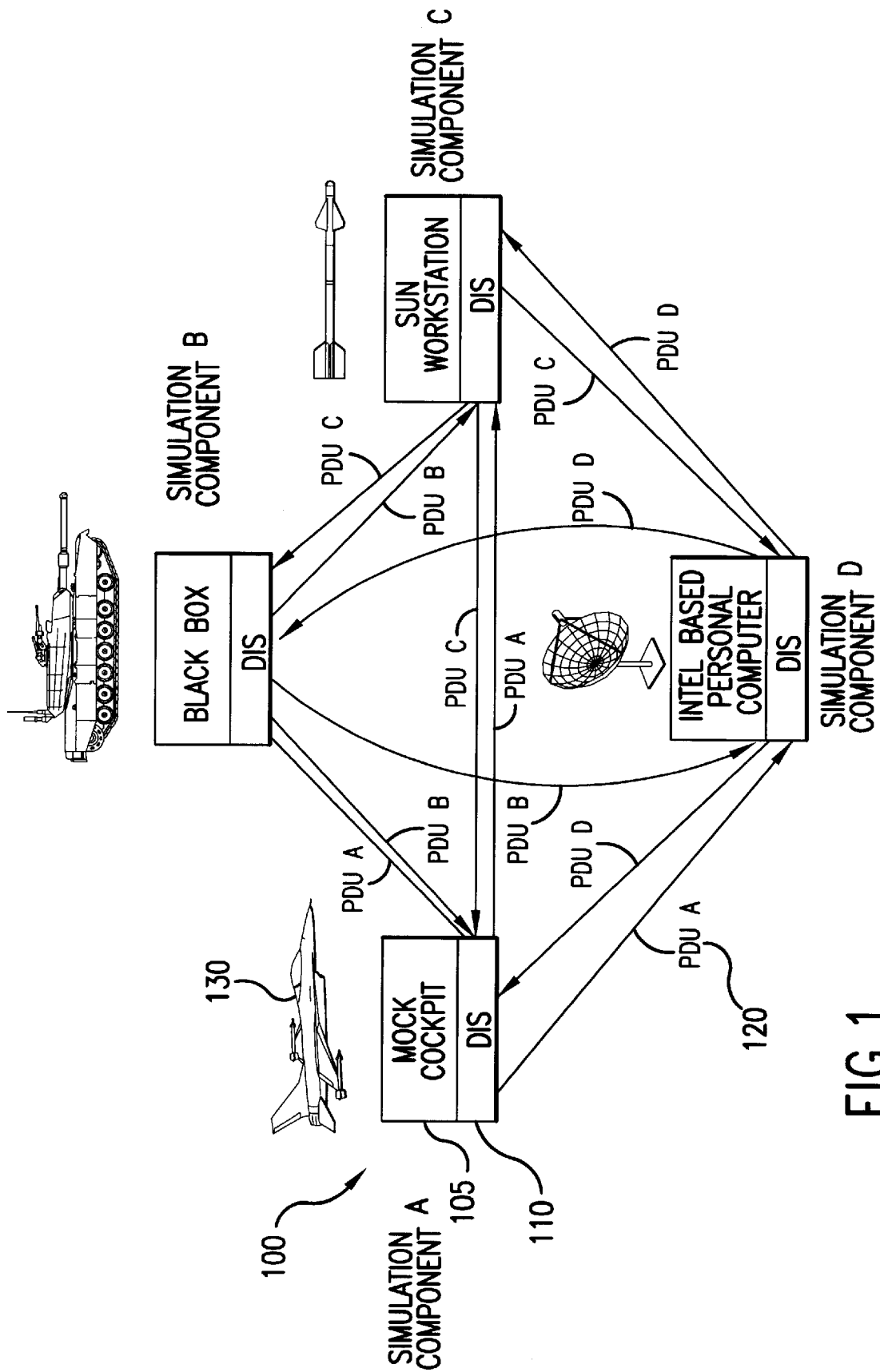
FIG. 1 is a block diagram depicting a prior art distributed simulation employing DIS protocol.
Figure 2:
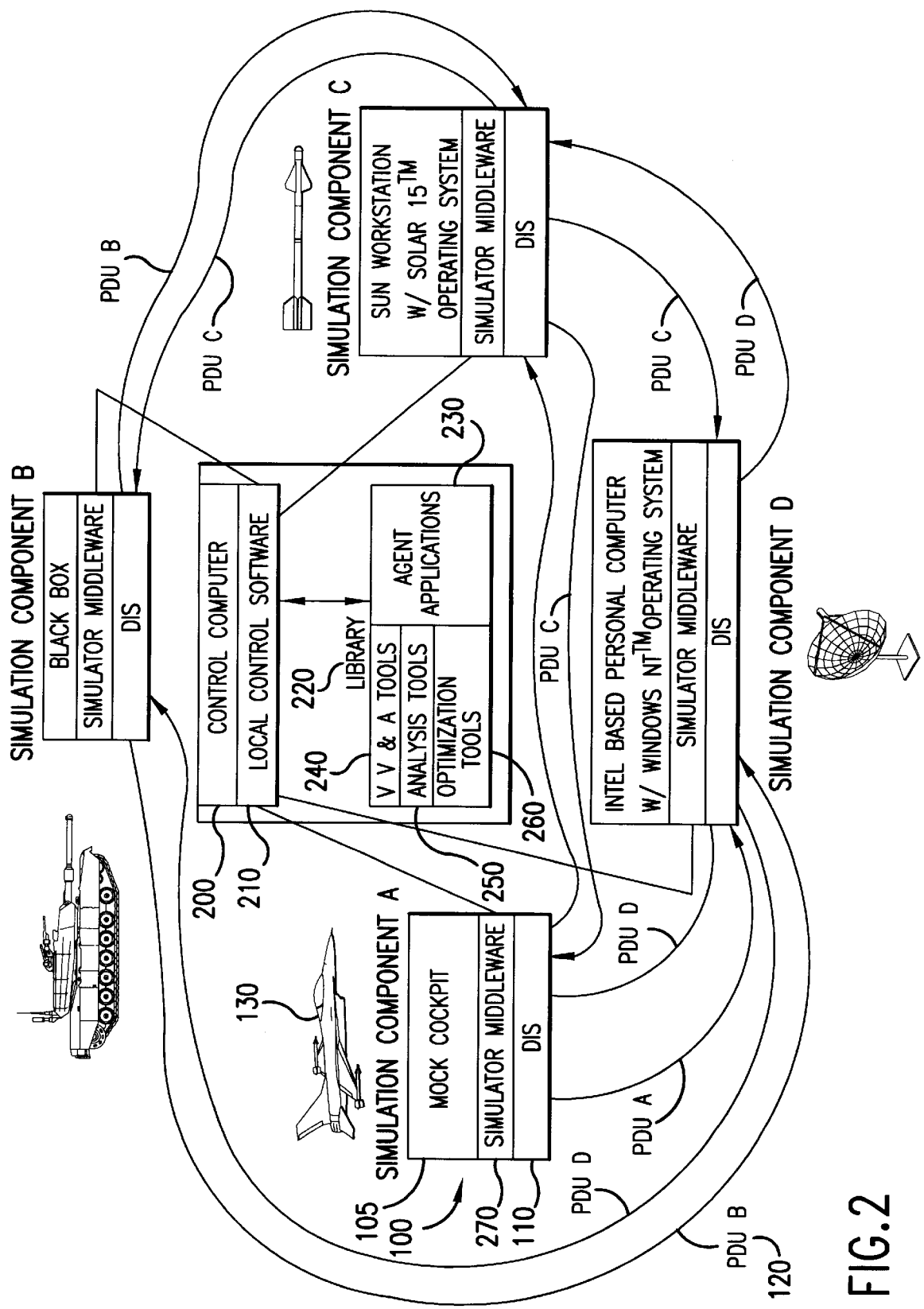
FIG. 2 is a block diagram depicting a distributed simulation employing a preferred embodiment of the present invention in addition to DIS protocol.

FIG. 2 is a block diagram depicting a preferred embodiment of the present invention as it would apply to the example of the distributed simulation illustrated in FIG. 1. As will be noted, the present invention is overlaid onto the distributed simulation of FIG. 1 without disturbing how the distributed simulation of FIG. 1 operates. This is an advantage of the present invention because it will not require that current investments in distributed simulation systems be lost or substantially undermined to practice the present invention.

The present invention adds simulator middleware 270 to each simulation component 100 and adds a control computer 200. Note that the simulator middleware 270 may be added to a live simulation such as depicted by the tank and black box of simulation component B via an Application Specific Integrated Circuit ("ASIC") or a Read Only Memory ("ROM") operational method to the black box in a manner known to those of skill in the art. Additional writable memory such as Random Access Memory ("RAM") may also be added to the black box to support downloading agent-applications to the live simulation component to the extent needed. Thus, the additional means required to practice the present invention in an existing distributed simulation are not substantial.

Figure 3:
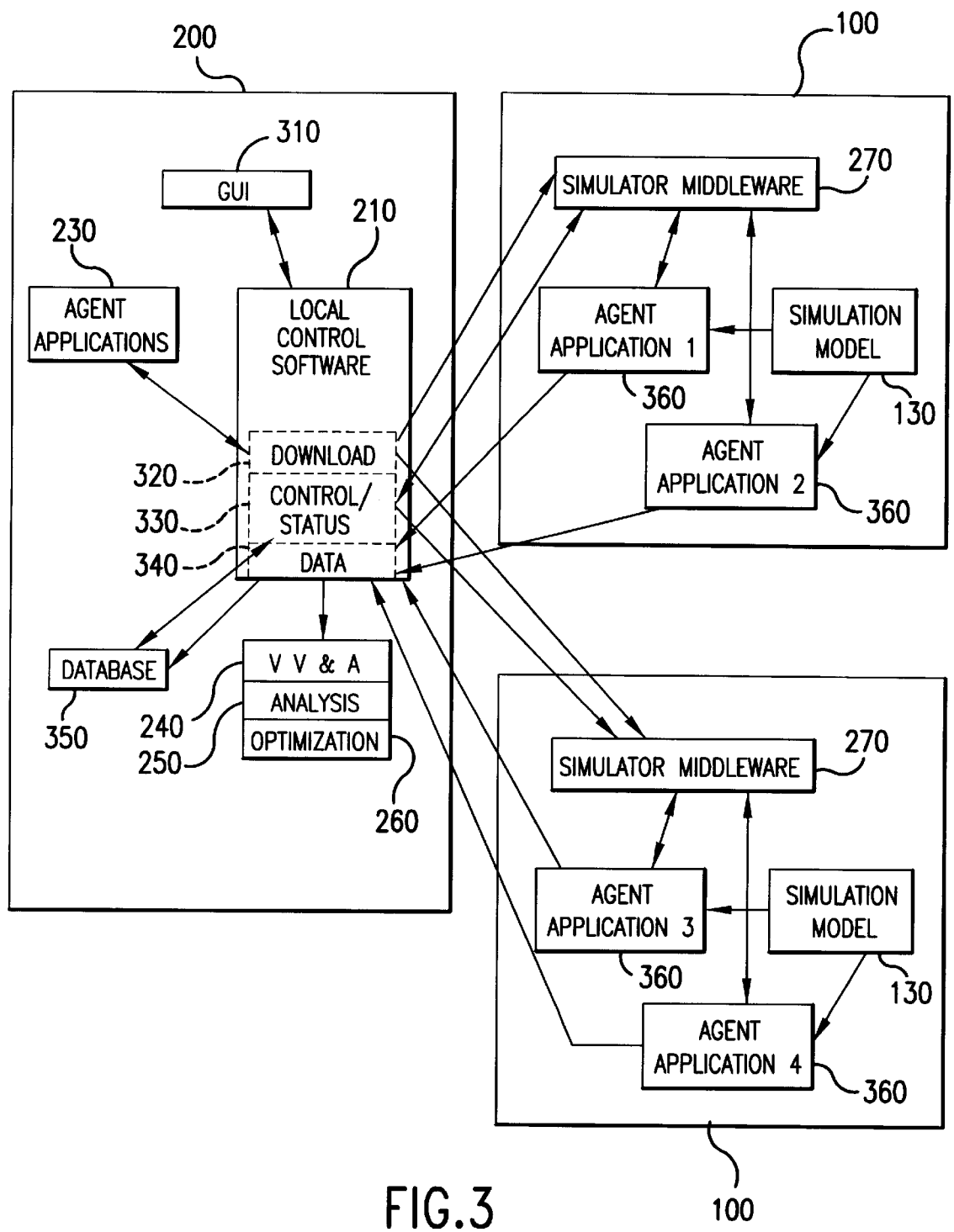
FIG. 3 is a simplified block diagram showing the relationship between a control computer 200 and two simulation components 100.

With reference to FIGS. 2 and 3, control computer 200 is comprised of local control software 210 which is in communication with the simulator middleware 270 on each of the simulation components 100, and the library 220, a graphical user interface 310 ("GUI"), a library of agent-applications 230, a set of tools 240, 250, and 260, and a database 350. The library 220 may be stored on a local hard drive or may be stored on a central storage device to which the control computer 200 is operatively connected. The library 220 is further comprised of a set of tools 240, 250, and 260 and a library of one or more agent-applications 230. The agent-applications stored in library 230 in a preferred embodiment are written in Java™, however, the agent-applications stored in library 230 may be written in any language understandable by one or more of the simulation processors 105. However, a language that is substantially platform independent and operating system independent such as Java™ is preferable because it allows greater interchangeability between agent-applications and simulator computers 105 and therefore introduces greater flexibility and adaptability into the present invention.

Although the present invention has been discussed in terms of a single control computer, the present invention is not limited to having a single control computer. For example, the present invention could be practiced where there are plural control computers 200 and a single library 220. Alternatively, a main library 220 could be provided with a supplemental library 220 resident on each control computer.

As will be described in more detail herein, the agent-applications 230 are programs designed to be sent to the simulators 100 to perform specific tasks such as gathering data from a simulator 100 regarding the resources of the simulator 100 or data provided to or generated by the simulation 130 resident on the simulator 100. Conversely, tools 240, 250 and 260 are designed to operate while resident on the control computer 200. However, any of the tools 240, 250, or 260 may interact with one or more of the agent-applications 230 to modify the agent-application to further the purpose of a particular tool making the modification, or the tool may in fact create an agent-application to further the tools.

Figure 4:
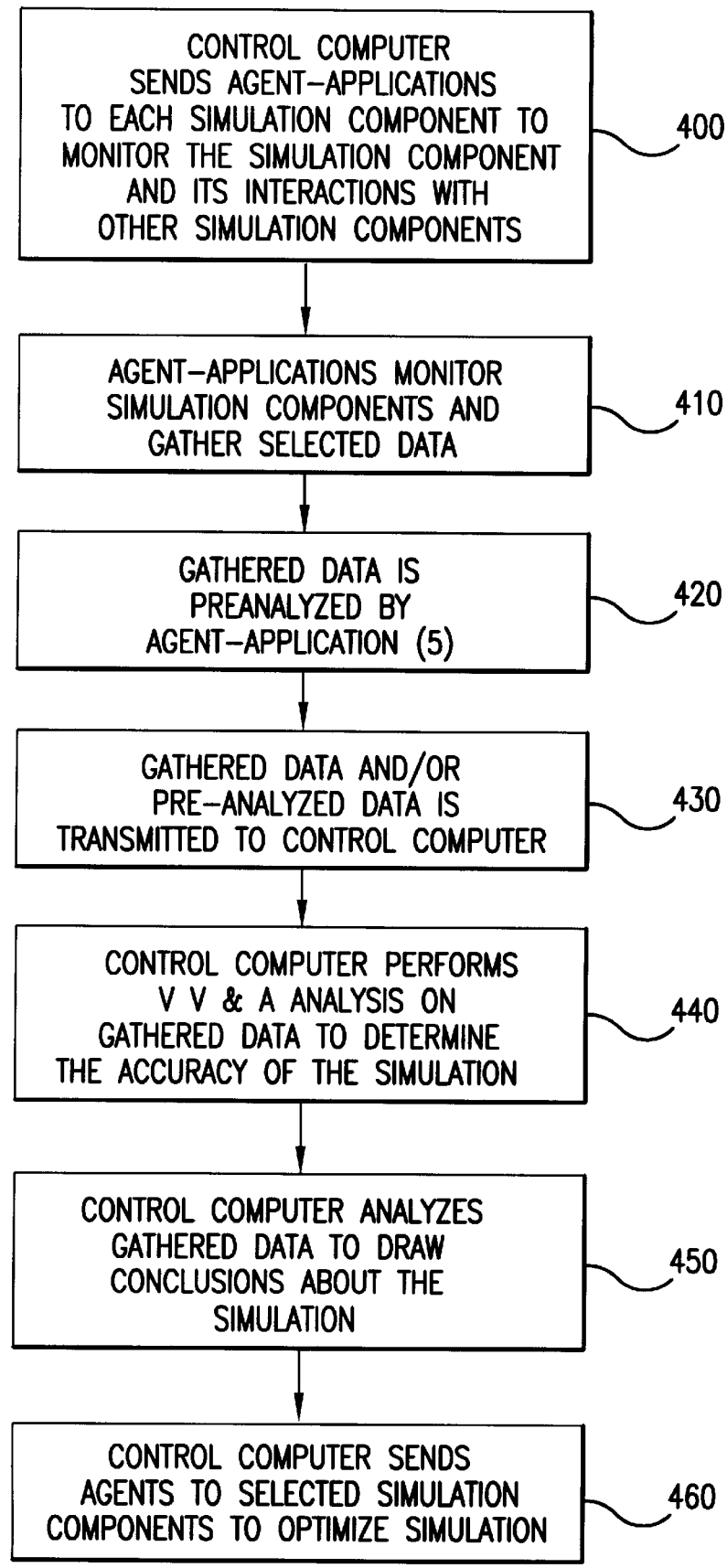
FIG. 4 is a flowchart illustrating program flow of a preferred embodiment of the present invention.

With reference to FIGS. 2, 3 and 4, at step 400 a control computer 200 sends agent-applications to each selected simulation component 100 to monitor the simulation component 100 and its interactions with other simulation components 100. In a preferred embodiment, the user of the control computer 200 may, by means of a graphical user interface 310, select one or more agent-applications from the library of agent-applications 230 for communication to one or more selected simulation components 100. Simulation components are selected for downloading of agent-applications by a control computer user through the graphical interface 310 via the download module 320 of local control software 210. Simulator middleware 270 of the simulation component 100 receiving agent-applications from the download module may accept, compile, execute and control the agent-application, monitor resources of the simulation component and monitor the status of the agent-applications 360 in a manner disclosed by applicant in applicants' copending application for A System and Method for Controlling and Monitoring Remote Distributed Processing Systems (Serial Number to be assigned) which is incorporated herein by reference.

The simulator middleware 270 authenticates, where appropriate, downloaded agent-applications. The simulation middleware 270 then causes the agent-applications to be executed according to operational instructions which may be received from local control software 210 as referenced in applicants' copending application. The executing agent-applications 360 then perform their tasks. In a preferred embodiment of the invention, the agent-applications monitor the simulation entity 130 and gather data relating to the simulation entity 130 such as what information input does the simulation entity 130 have (e.g., what information is in the PDUs that the simulation entity 130 is receiving or sending, how often are PDUs received/sent, etc.), or about the simulation component 100 system resources (e.g., what available random access memory, hard disk storage space, processing power, and/or communication bandwidth is available to the simulation component 100). Each simulation component 100 may have a different set of executing agent-applications 360 than any other simulation component. While step 410 indicates that the agent-applications gathers selected data about a simulation component 100 and its simulation entity 130, the agent-applications could perform other tasks such as filtering the data flow into or out of simulation entity 130.

At step 420, the data gathered by executing agent-applications 360 may be preanalyzed by the executing agent-application 360. In such a pre-analysis, the executing agent-application 360 may screen the gathered data to eliminate irrelevant data and/or could reach intermediate conclusions. For example, the agent-application may add certain variables together or select the highest value of a discrete set of data. Step 420 is optional, but may be useful, for example, where communication bandwidth or control computer processing power is relatively scarce and pre-analysis streamlining is desired.

At step 430, data gathered by the executing agent-applications 360 and/or pre-analyzed data as described above in step 420 is transmitted to the local control software 210 preferably to a data module 340 of the control software 210. Data module 340 may store the transmitted data in a database 350 for later use such as analysis by one or more of the tools 240, 250 or 260 or data module 340 may provide transmitted data directly to one or more of the tools 240, 250 and 260.

In step 440, the VV&A analysis tool 240 performs a verification (i.e., "Does everything work in the manner it was designed to work?") validation (i.e., "Is everything correct according to reality over a certain set of inputs?") and accreditation (i.e., automatically approving an application for a particular purpose according to guidelines or preparing data to facilitate human approval of an application for a particular purpose) analysis on either the data directly from the data module 340 or from the data stored in database 350 to determine the accuracy of the distributed simulation. For example, the VV&A tools would ensure that all simulation components could "see" a mountain which another simulation component "sees." To continue the example this is to avoid a situation, for example, where Tank A sees Tank B but Tank B can't see Tank A because Tank A's line of sight is not blocked by the mountain between the two tanks but Tank B's line of sight is blocked by the mountain.

At step 450, the control computer 200, through the use of analysis tools 250 (e.g., COTS, GOTS, or customized software), analyzes the data either from the data module 340 or the database 350 to draw conclusions about the simulation. For example, the analysis tools may calculate performance data such as, in the example of military simulations, probability of kill or other measures of effectiveness, and the analysis tools may also produce graphs based on this information.

At step 460, the control computer 200 utilizes optimization tools 260 to optimize a solution to the distributed simulation problem and may be based on conclusions drawn by the analysis tools at step 450. The optimization tools then may modify existing agent-applications in the agent-applications library 230 or create new agent-applications which are then sent to selected simulation components 100 in order to rerun the distributed simulation with different parameters. For example, the optimization tools may consist of software which selects in a manner known to those of skill in the art certain simulation parameters believed to yield a more optimal solution and then reruns the distributed simulation. For instance, based upon the data gathered from a distributed battle simulation and/or any analysis performed on that data, optimization software may decide that if a particular side had five additional tanks located in various positions, that would yield a more optimal result and the optimization software would rerun the distributed simulation with five additional tanks in the identified positions. Such optimization tools could take various factors into account such as, in our example, what is the cost of adding five additional tanks and how soon would the battle reach a successful conclusion versus how much would it cost to add two additional airplanes and how soon would the battle reach a successful conclusion.

In a preferred embodiment of the present invention, the present invention operates concurrently with the distributed simulation. It is also preferable for the simulation processor to have the means to run more than one process concurrently, for example, Windows 95™ or any other multitasking operating system would enable an Intel-based personal computer such as that shown in simulation component D of FIG. 2 to run more than one process or program at a time. It is further preferable to have the simulator middleware and agent-applications resident on simulation components running in the "background" and processes involved with the simulation running in the "foreground" so that the present invention will have little or no adverse impact on the distributed simulation.

In a preferred embodiment of the invention, simulation components can be managed by the control computer (e.g., the control computer may instruct the simulation components to turn on or turn off or go left, etc.). This capability can be useful for a number of reasons which will be apparent to those skilled in the art including correcting a malfunction in a simulation component or minimizing the effect of a malfunction in a simulation component on the distributed simulation overall.

The present invention has been described above with reference to preferred embodiments. However, those skilled in the art will recognize that changes and modifications may be made in these preferred embodiments without departing from the scope of the present invention.

What we claim is:

1. A method of concurrently monitoring from one or more control computers a running distributed simulation on at least one simulation component running independently from said one or more control computers, said distributed simulation being formed by at least two simulation components running in hetrogeneous environments, comprising the steps of:

communicating instructions to said simulation component from said control computer; and collecting data from said simulation component responsive to said communicated instructions.

2. The method according to claim 1 further comprising the step of communicating information to one or more of said one or more control computers responsive to said collected data.

3. The method of claim 1 wherein said communicated instructions do not disturb the distributed simulation.

4. The method according to claim 1 wherein said step of collecting data is performed in the absence of further communicated instructions.

5. The method according to claim 1 further comprising the step of creating instructions for collecting data and communicating information prior to said step of communicating instructions.

6. The method according to claim 2 further comprising the step of verifying whether the distributed simulation is accurate based upon said communicated information after said step of communicating information.

7. The method of claim 6 further comprising the step of validating the distributed simulation based upon said communicated information.

8. The method of claim 6 further comprising the steps of:

detecting inaccuracies in the distributed simulation;

identifying simulation components causing inaccuracies in the distributed simulation;

selecting identified simulation components causing inaccuracies; and sending customized instructions to selected simulation components from said control computer to correct the inaccuracies in the distributed simulation.

9. The method of claim 8 further comprising the steps of:

determining the cause of the detected inaccuracies; and creating customized instructions to be sent according to said sending step which are responsive to the cause determined in said cause determining step, wherein said creating step occurs prior to said sending step.

10. The method of claim 1 further comprising the step of pre-analyzing said collected data prior to said step of communicating information.

11. A method of optimizing a distributed simulation conducted by at least one simulation component the steps comprising:

requesting information from said simulation components, said request being made by a control computer independent of said simulation component;

receiving at said control computer said requested information; and determining optimal distributed simulation parameters based upon said requested information.

12. The method of claim 11 further comprising the steps of:

implementing the optimal parameters; and running the distributed simulation.

13. The method of claim 12 wherein said implementing step comprises the steps of:

downloading agent-applications to at least one of said at least one simulation components; and executing said downloaded agent-applications.

14. A system for controlling a distributed simulation comprising:

plural independent simulation components;

at least one control computer having local control means for communicating instructions to said plural simulation components;

a communication medium operatively connecting said plural simulation components with said at least one control hosts;

wherein each of said plural simulation components has control means responsive to said communicated instructions which is capable of (a) collecting data from the one of said plural simulation components to which said instructions have been communicated, and (b) communicating information to said local control means responsive to the data collected.

15. The system of claim 14 wherein said at least one control computer further comprises means for verifying the accuracy of the distributed simulation based upon said communicated information.

16. The system of claim 14 wherein said at least one control computer further comprises means for analyzing said communicated information and reaching a conclusion.

17. The system of claim 14 wherein said at least one control computer further comprises means for optimizing the distributed simulation based upon said communicated information.

18. A computer program product having a computer readable medium containing computer readable code recorded thereon for monitoring a distributed simulation conducted on one or more simulation components from a control computer comprising:

means for accessing a library having one or more agent-applications stored thereon;

means for providing one or more of said one or more agent-applications to one or more of said one or more simulation components;

means for receiving data from said simulation components to which said agent-applications were provided, wherein the data received is in relation to executing said provided agent-applications on said one or more simulation components to which they are provided; and means for verifying the accuracy of said distributed simulation based upon said received data.

19. The computer program product of claim 18 further comprising means for analyzing said received data.

20. The computer program product of claim 18 further comprising means for optimizing said distributed simulation as a function of said received data.

21. The computer program product of claim 20 wherein said means for optimizing comprises:

means for determining a set of optimal parameters;

means for selecting one or more agent-applications from said library responsive to said set of optimal parameters;

means for selecting one or more of said one or more simulation components responsive to said set of optimal parameters; and wherein said selected agent-applications are provided to said selected simulation components.

22. The computer program product of claim 20 wherein said means for optimizing comprises:

means for determining a set of optimal parameters;

means for creating one or more agent-applications responsive to said set of optimal parameters;

means for selecting one or more of said one or more simulation components responsive to said set of optimal parameters; and wherein said created agent-applications are provided to said selected simulation components.

23. The computer program product of claim 20 wherein said means for optimizing comprises:

means for determining a set of optimal parameters;

means for modifying one or more agent-applications from said library responsive to said set of optimal parameters;

means for selecting one or more of said one or more simulation components responsive to said set of optimal parameters; and wherein said modified agent-applications are provided to said selected simulation components.

24. The computer program product of claim 18 further comprising means for controlling said provided agent-applications executing on said simulation components to which they are provided.

25. The computer program product of claim 18 further comprising a graphical user interface for facilitating communication between a user and one or more of said means for providing, said means for receiving, said means for verifying, said means for analyzing, and said means for optimizing.

* * * * *